US006859906B2

(12) United States Patent
Hammons et al.

(10) Patent No.: US 6,859,906 B2
(45) Date of Patent: Feb. 22, 2005

(54) SYSTEM AND METHOD EMPLOYING A MODULAR DECODER FOR DECODING TURBO AND TURBO-LIKE CODES IN A COMMUNICATIONS NETWORK

(75) Inventors: Roger Hammons, N. Potomac, MD (US); Bharath Venkartaramn, Gaithersburg, MD (US); Mustafa Eroz, Germantown, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 502 days.

(21) Appl. No.: 09/781,658

(22) Filed: Feb. 12, 2001

(65) Prior Publication Data

US 2001/0039636 A1 Nov. 8, 2001

Related U.S. Application Data

(60) Provisional application No. 60/181,598, filed on Feb. 10, 2000.

(51) Int. Cl.[7] .............................................. H03M 13/00
(52) U.S. Cl. ...................................................... 714/786
(58) Field of Search ................................ 714/786, 755, 714/780, 746, 752, 799, 797, 794, 795; 375/262, 265, 341; 341/51, 94, 143

(56) References Cited

U.S. PATENT DOCUMENTS

| | | | |
|---|---|---|---|
| 5,351,047 A | 9/1994 | Behlen | 341/67 |
| 5,446,747 A | 8/1995 | Berrou | 714/788 |
| 5,983,385 A | 11/1999 | Khayrallah et al. | 714/755 |
| 6,141,388 A * | 10/2000 | Servais et al. | 375/262 |
| 6,304,995 B1 * | 10/2001 | Smith et al. | 714/786 |

FOREIGN PATENT DOCUMENTS

| | | |
|---|---|---|
| EP | 0 855 715 A2 | 7/1998 |
| EP | 0 920 164 A2 | 2/1999 |
| EP | 1 024 601 A1 | 1/2000 |
| FR | 2 724 522 A | 3/1996 |
| GB | 0714213 A1 * | 5/1996 ............ H04N/7/50 |

OTHER PUBLICATIONS

Gamal et al., Analyzing the Turbo decoder using the Gaussian approximation, Feb. 2001, IEEE Trans. on Info. Theory. vol. 47, No. 2, p. 671–686.*

Hagenauer et al. Iterative decoding of binary block and convolutional codes, Mar. 1996, IEEE Trans. on Info. Theory, vol. 42, No. 2, p. 429–445.*

Benedetto et al., Design guidlines of parallel concatenated convolutional codes, 1995, IEEE, p. 2273–2277.*

Berrou et al. Near shannon limiting error correcting coding and decoding: Turbo codes, 1993, IEEE, 1064–1070.*

Z. Blazek and V.K. Bhargava, "A DSP–Based Implementation of a Turbo–Decoder", Dept. of Electrical and Computer Engineering, 1998.

* cited by examiner

*Primary Examiner*—Shelly A. Chase
(74) *Attorney, Agent, or Firm*—John T. Whelan

(57) ABSTRACT

A system and method for decoding encoded data is provided. A parser receives and parses the encoded data into data streams, with each of the data streams including a portion of said encoded data. A decoder decodes the data streams to provide decoded data which includes soft decision data. The decoder performs an decoding iteration on each of the data streams to provide the decoded data, and performs such decoding iterations based on additional information. The system and method alternatively can be configured without a parser, and can employ at least one soft decoder module and another decoder module. The soft decoder module performs multiple decoding iterations on the encoded data to provide soft decision data and the other decoded module decodes the encoded data based on the soft decision data to provide hard decoded data representative of a decoded condition of said encoded data and/or soft decision data.

48 Claims, 9 Drawing Sheets

SYSTEM AND METHOD EMPLOYING A MODULAR DECODER FOR DECODING TURBO AND TURBO-LIKE CODES IN A COMMUNICATIONS NETWORK

The present invention claims benefit under 35 U.S.C. § 119(e) of a U.S. patent application Ser. No. 60/181,598, filed Feb. 10, 2000, the entire contents of which is incorporated herein by reference.

BACKGROUND OF THE INVENTION

1. Field of the Invention

The present invention relates to a modular decoder employing at least one constituent decoder for decoding encoded data, such as turbo or turbo-like encoded digital data. More particularly, the present invention relates to system and method for decoding encoded data, such as turbo encoded digital data, that employs one or more cascadable modular decoders arranged such that each decoding iteration provides information relevant to decoding the data to its succeeding decoding iteration to improve decoding accuracy.

2. Description of the Related Art

Forward error correction (FEC) is necessary in terrestrial and satellite radio systems to provide high quality communication over the radio frequency (RF) propagation channel, which generally induces distortions in the signal waveform, including signal attenuation (free space propagation loss) and multi-path fading. These distortions drive the design of radio transmission and receiver equipment, the design objective of which is to select modulation formats, error control schemes, demodulation and decoding techniques, and hardware and software components that cooperate to provide an efficient balance between product performance and implementation complexity that drives product cost. Differences in propagation channel characteristics, such as between terrestrial and satellite communication channels, naturally result in significantly different system designs. Likewise, existing communications systems continue to evolve to satisfy higher system requirements for faster data rates and higher fidelity communication services.

A relatively new forward error correction scheme includes turbo codes and turbo like codes, which have been demonstrated to yield bit error rate (BER) performance close to the theoretical limit for useful classes of idealized channels by means of an iterative soft-decision decoding method. In this context, soft-decision refers to associating a confidence value with each demodulated information bit, in contrast to hard-decision demodulation, in which the demodulator decides whether each information bit is a one or a zero. The confidence value is generally expressed as one or more bits. The confidence value may be further refined by appropriate decoding techniques to converge to a high level of confidence in the systematic bits, thus reducing bit error rate (BER).

A turbo code typically consists of a concatenation of at least two or more systematic codes. A systematic code generates two or more bits from an information bit, or systematic bit, of which one of these two bits is identical to the information bit. The systematic codes used for turbo encoding are typically recursive convolutional codes, called constituent codes. Each constituent code is generated by an encoder that associates at least one parity data bit with one systematic or information bit. The systematic bit is one bit of a stream of digital data to be transmitted. The parity data bit is generated by the encoder from a linear combination, or convolution, of the systematic bit and one or more previous systematic bits. The bit order of the systematic bits presented to each of the encoders is randomized with respect to that of a first encoder by an interleaver so that the transmitted signal contains the same information bits in different time slots. Interleaving the same information bits in different time slots provides uncorrelated noise on the parity bits. A parser may be included in the stream of systematic bits to divide the stream of systematic bits into parallel streams of subsets of systematic bits presented to each interleaver and encoder. The parallel constituent codes are concatenated to form a turbo code, or alteratively, a parsed parallel concatenated convolutional code.

The ratio of the number of information bits to the number of parity bits in the transmitted signal is termed the code rate. For example, a code rate of 1/3 indicates that two parity bits are transmitted with each information bit. Repeated source data bits and some of the parity bits in the concatenated constituent codes may be removed or "punctured" according to a puncturing scheme before transmitting to increase the code rate. When a data stream is punctured, certain bits of the data stream are eliminated from the data stream transmission. For example, if a data stream having a length of 1000 bits is encoded at rate 1/3, 3000 bits are generated. To obtain a code rate 1/2, 1000 bits out of the 3000 bits are punctured or, in other words, not transmitted, to obtain 2000 transmitted bits.

After the encoded bits are transmitted over the RF channel, a demodulator recovers the source data at the receiver. In a typical turbo code decoder, soft channel information pertaining to the parity bits and systematic bits, as well as soft decision likelihood values representative of the confidence level of the estimated systematic bits, are input to a first constituent decoder. The decoder generates updated soft decision likelihood values for the estimated systematic bits. The updated soft decision likelihood values are passed to a second constituent decoder as a priori information after reordering in accordance with an interleaver identical to that used by the second constituent encoder in the turbo encoder.

In addition to the a priori information received from the first decoder, the second decoder uses the soft decision values for the estimated systematic bits and second encoder's parity bits to produce new updated values for the soft decision likelihood values. The soft decision likelihood values output from the second decoder containing updated likelihood information for the systematic bits are then fed back to the first decoder as a priori information, and the process is repeated. This decoding process may be repeated indefinitely, however, more than a small number of iterations generally result in diminishing returns. After the last iteration of the decoding process, a final decoder makes hard decisions that determine the systematic bits from this soft channel information and the soft decision likelihood values. One example of a conventional decoder is described in U.S. Pat. No. 5,446,747, the entire content of which is incorporated herein by reference.

The reliability of the hard decisions used to recover the source data bits clearly increases with the number of symbols taken into account. The higher the number of symbols, however, the more complex the decoder. The memory required quickly becomes substantial, as do the corresponding computation times.

The integrated circuits that implement turbo decoders are based on a compromise between cost and performance characteristics. These practical considerations prevent the construction of turbo decoders that correspond optimally to a given application.

A need therefore exists for a decoder that is capable of efficiently and effectively decoding data that has been encoded by, for example, a turbo or concatenated convolutional encoder, and that does not suffer from the drawbacks associated with conventional decoders as discussed above.

SUMMARY OF THE INVENTION

The above problems associated with the decoders discussed above are substantially overcome by providing a system and method for decoding encoded data, employing a parser and at least one decoder. The parser is adapted to receive and parse the encoded data into a plurality of parsed data streams, with each of the parsed data streams including a portion of said encoded data. The decoder is adapted to decode the parsed data streams based on at least information included in the parsed data streams to provide decoded data which includes soft decision data. The decoder can perform a respective decoding iteration on each respective one of the parsed data streams to provide the decoded data, and can perform such decoding iterations based on additional information, such as parity information, pertaining to the data in the parsed data streams. Alternatively, the decoder can include a plurality of decoders, each adapted to decode a respective one of the parsed data streams to output a respective decoded data stream as a portion of the decoded data. Each decoder can include a constituent decoder, and the encoded data can include various types of data, such as direct video broadcast data.

The above problems are further substantially overcome by providing a system and method for decoding encoded data, employing at least one soft decoder module and another decoder module. The soft decoder module can perform multiple decoding iterations on the encoded data to provide soft decision data relating to the encoded data, and the other decoder module is adapted to decode the encoded data based on the soft decision data to provide at least one of hard decoded data representative of a decoded condition of said encoded data and soft decision data relating to said encoded data. In particular, the soft decoder module can provide the soft decision data without providing any hard decision data relating to the encoded data. The system and method can employ a plurality of the soft decoder modules, arranged in succession such that a first soft decoder modules in the succession is adapted to receive at least a respective portion of the encoded data and decode the respective portion of the encoded data based on at least information included in the respective portion of the encoded data to provide soft decision information relating to the encoded data, and of the decoder modules other than the first decoder module is adapted to receive at least a respective portion of the encoded data and decode its the respective portion of the encoded data based on at least information included in it's the respective portion of the encoded data and the intermediate soft decision data provided from at least one other of the decoder modules, to provide soft decision information. The soft decision information from the last soft decoder module in the succession is soft decision data. Each soft decoder module can include at least one decoder, adapted to perform at least one of the decoding iterations, or can include a plurality of decoders, which are each adapted to perform a respective one of the decoding iterations. Each soft decoder module can also include a buffer, adapted to temporarily store information pertaining to decoding the encoded data while the decoding iterations are being performed.

BRIEF DESCRIPTION OF THE DRAWINGS

These and other objects, advantages and novel features of the invention will be more readily appreciated from the following detailed description when read in conjunction with the accompanying drawings, in which.

DETAILED DESCRIPTION OF THE PREFERRED EMBODIMENTS

Turbo codes are especially applicable to digital data communications systems because of their excellent error correction capabilities at low signal-to-noise ratios and their flexibility in trading off bit error rate and frame error rate performance to processing delay.

Figure 1:
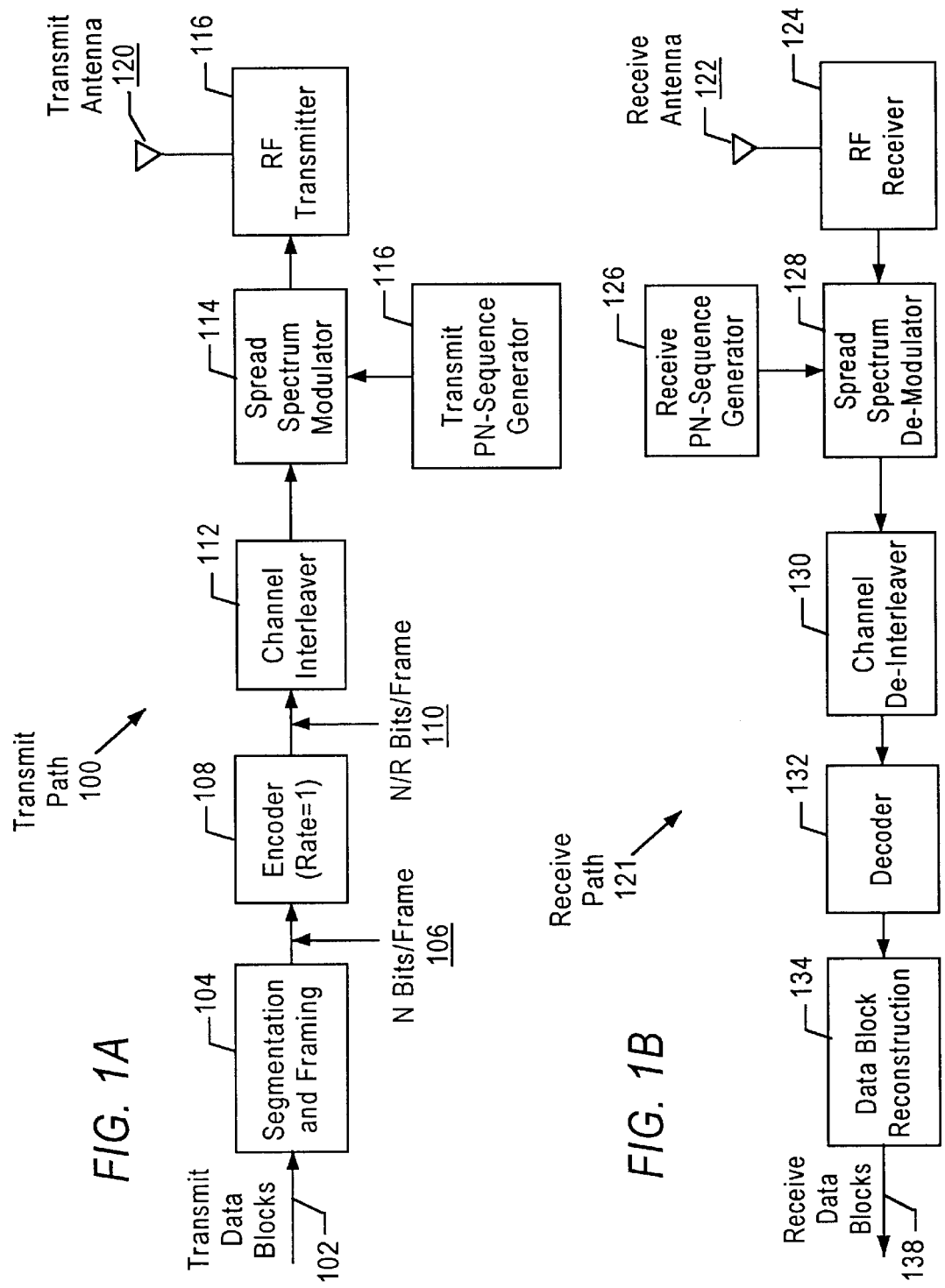
FIG. 1 is a functional block diagram of an example of a forward or a reverse link in an exemplary communications system that can employ a decoder according to an embodiment of the present invention.

FIG. 1 is a functional block diagram of an example of a forward or a reverse link in an exemplary communications system, such as a code division multiple access (CDMA) digital communications system, that can employ a decoder according to an embodiment of the present invention. As shown in FIG. 1, the forward or reverse link includes a transmit path 100 into which transmit data 102 are input. Specifically, the transmit path 100 includes a segmentation and framing processor 104 that receives the transmit data 102 and outputs an N bits per frame output 106, an encoder, such as a parsed parallel concatenated convolutional code ($P^2CCC$) encoder 100 that receives the output 106 and provides an N/R bits per frame output 110, a channel interleaver 112 that receives the output 110, a spread spectrum modulator 114, a transmit pseudo-random (PN) noise sequence equalizer 116, a radio frequency (RF) transmitter 118, and a transmit antenna 120. The receive path 121 includes a receive antenna 122, a radio frequency (RF) receiver 124, a receive pseudo-random (PN) noise sequence generator 126, a spread spectrum demodulator 128, a channel de-interleaver 130, a decoder 132, such as a parsed parallel concatenated convolutional code ($P^2CCC$) decoder 132, and a data block reconstruction module 134 that provides a received data output 136.

As can be appreciated by one skilled in the art, the arrangement shown in FIG. 1 can be employed as a forward link or a reverse link in a digital communications system implementing turbo codes that is well known in the art of spread spectrum communications systems For example, the arrangement shown in FIG. 1 represents a forward link if the transmit path 100 is in the base station and the receive path 121 is in a mobile unit of the communications system. Conversely, the arrangement shown in FIG. 1 represents a reverse link if the transmit path 100 is in the mobile unit and the receive path 121 is in the base station. While a CDMA communications system is illustrated in this example, turbo encoding can also be employed in other communications systems, such as time division multiple access (TDMA) systems, as well as 3G, 3GPP, 3GPP2, direct video broadcast (DVB) systems, and so on.

As discussed briefly above, the transmit path 100 includes the segmentation processor 104 that segments and frames the transmit data blocks 102 output from transmit data terminal equipment (not shown) and outputs frames having N bits per frame 106 that are received as an input data stream by the parsed parallel concatenated convolutional code ($P^2CCC$) encoder 108. The parsed parallel concatenated convolutional code ($P^2CCC$) encoder 108 has a code rate of R and outputs an encoded stream of code symbols 110 at a bit rate of N/R bits per frame to the channel interleaver 112. The channel interleaver 112 may optionally be used to re-order bits so that consecutive bits in a data stream are not lost in a noise burst.

The spread spectrum modulator 114 uses a specific pseudo-random code from the transmit PN-sequence generator 116 to generate a spread spectrum signal from the code symbols and outputs the spread spectrum signal to the RF transmitter 118. The RF transmitter 118 modulates an RF carrier by the spread spectrum signal and outputs the modulated radio frequency signal to the transmit antenna 120. The transmit antenna 120 broadcasts the radio frequency signal to the base station in the reverse link or to the mobile unit in the forward link.

Still referring to FIG. 1, the receive path 121 includes the receive antenna 122 that receives the radio frequency signal broadcast from the transmit antenna 120 and outputs the radio frequency signal to the RF receiver 124. The RF receiver 124 amplifies the radio frequency signal, removes the RF carrier, and outputs the spread spectrum signal to the spread spectrum demodulator 122. The spread spectrum demodulator 128 uses a pseudo-random code from the receive PN-sequence generator 126 identical to that generated by the transmit PN-sequence generator 116 to demodulate and de-spread the spread spectrum signal. The spread spectrum demodulator 125 outputs demodulated information bits and soft-decision likelihood values to the channel de-interleaver 130 if the channel interleaver 130 is used, or else directly to the parsed parallel concatenated convolutional code ($P^2CCC$) decoder 132. The $P^2CCC$ decoder 132 decodes the source data information bits from the code symbols and outputs N-bit frames of source data information bits to the reconstruction processor 134. The reconstruction processor 134 reconstructs the source data blocks from the N-bit frames and outputs the receive data blocks 136 to receive data terminal equipment (not shown).

Figure 2:
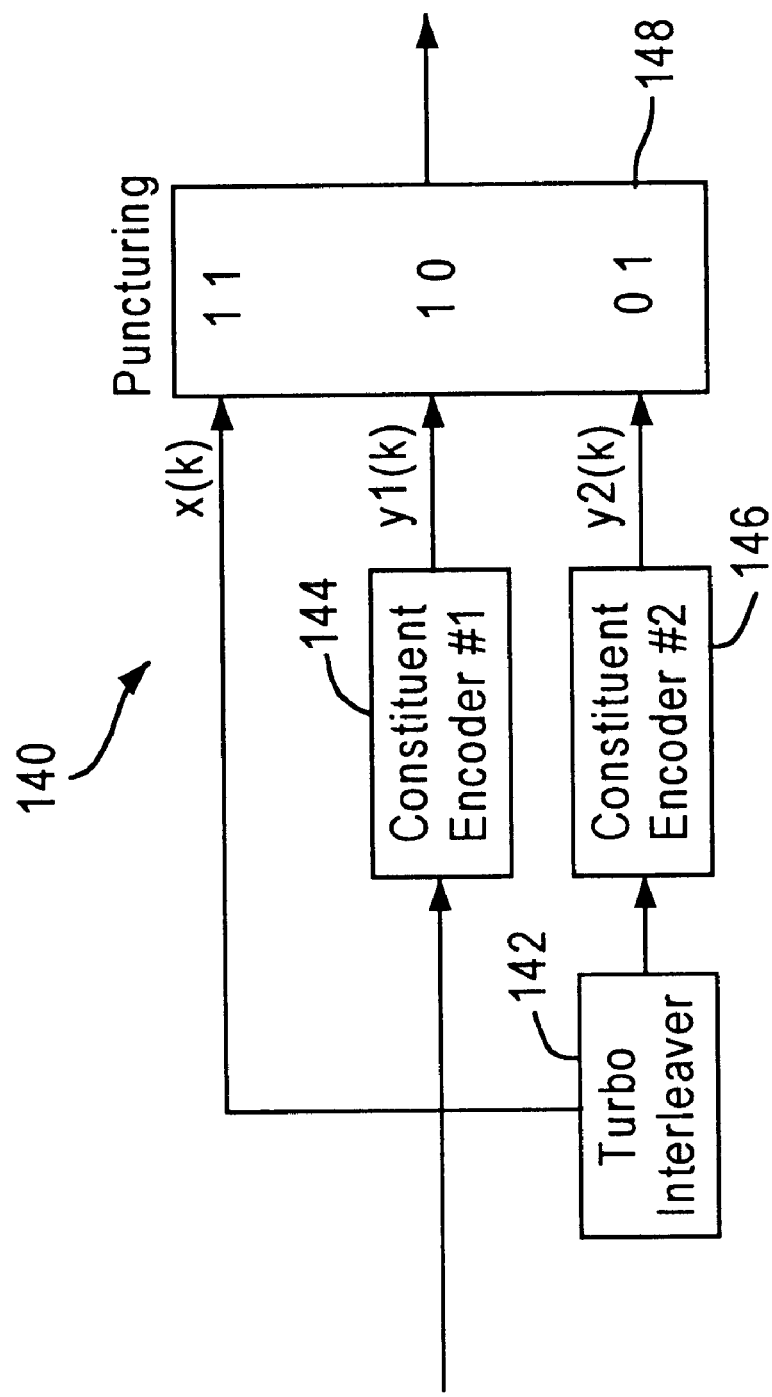
FIG. 2 is a functional block diagram of an example of a turbo code encoder that can be employed in the transmit path of the system shown in FIG. 1.

FIG. 2 illustrates a turbo encoder 140 consisting of a turbo interleaver 142 and the parallel concatenation of two constituent encoders 144 and 146 in which the input stream x(k) is encoded by both encoders to produce parity bits y1(k) and y2(k). The second encoder 146 sees the input stream presented in a different order than the first encoder 144 due to the action of the embedded turbo interleaver 142. The output coded bits x(k), y1(k), y2(k) can then be punctured by a puncturer 148 to produce the desired overall code rate. In the example, the natural rate of the turbo encoder is 1/3. The turbo encoder 140 provides a periodic puncturing pattern that produces an output code rate equal to 1/2.

Figure 3:
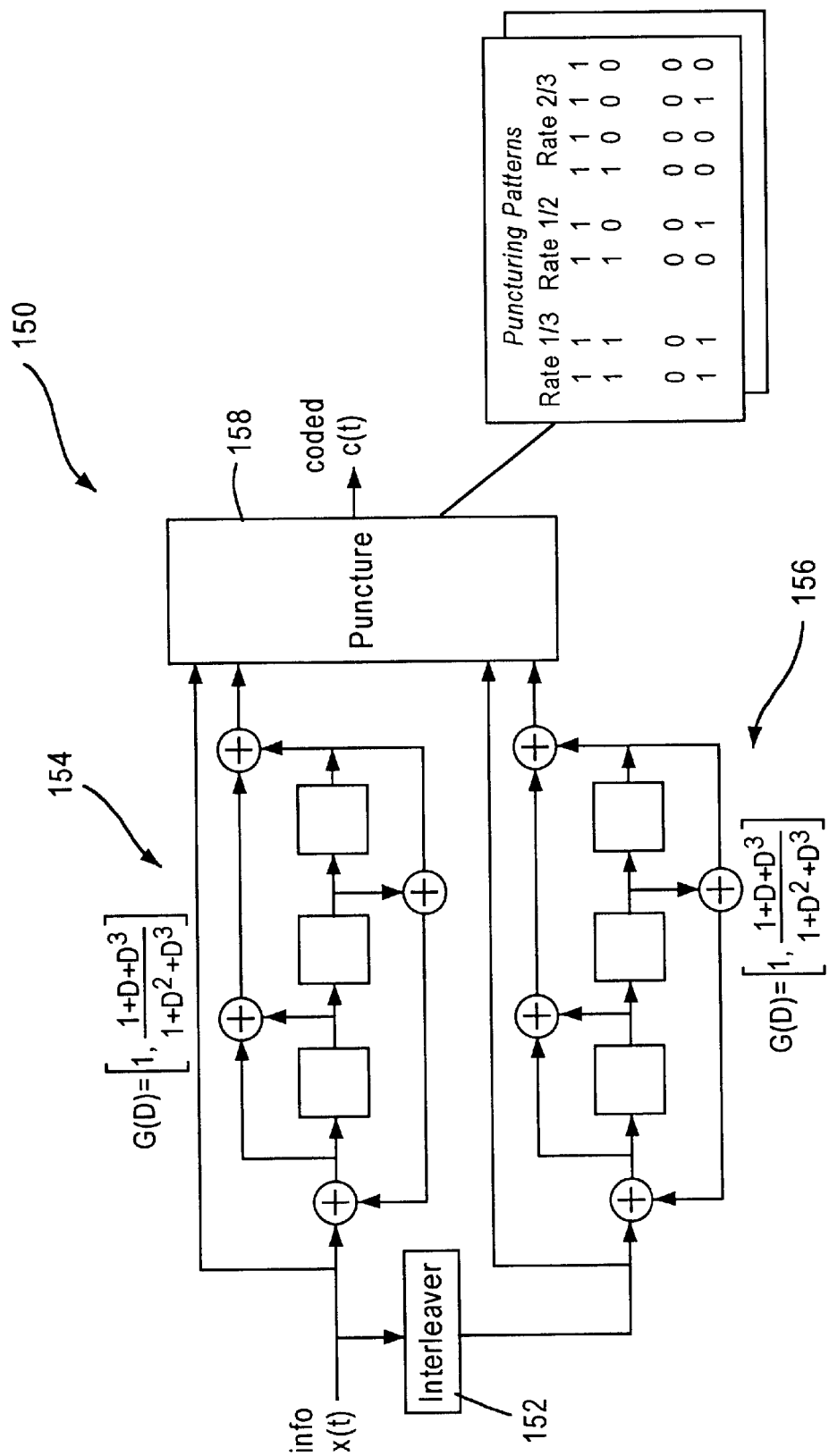
FIG. 3 is a functional block diagram of an example of a turbo code encoder for third generation CDMA systems that can be employed in the transmit path of the system shown in FIG. 1.

FIG. 3 illustrates an example of an encoder 150 for a turbo code proposed for third generation CDMA systems. This encoder 150 consists of an interleaver 152 two constituent codes 154 and 156 that are systematic recursive convolutional codes having the indicated transfer function G(D). The constituent codes are rate 1/2 (producing one parity bit for each input information bit) and have 8 trellis states (shift register has three delay elements). The overall rate of the turbo code is thus R-1/3, since each information bit produces two parity bits, one from each constituent encoder, A puncturer 158 can apply various puncturing patterns as shown to increase the code rate.

Figure 4:
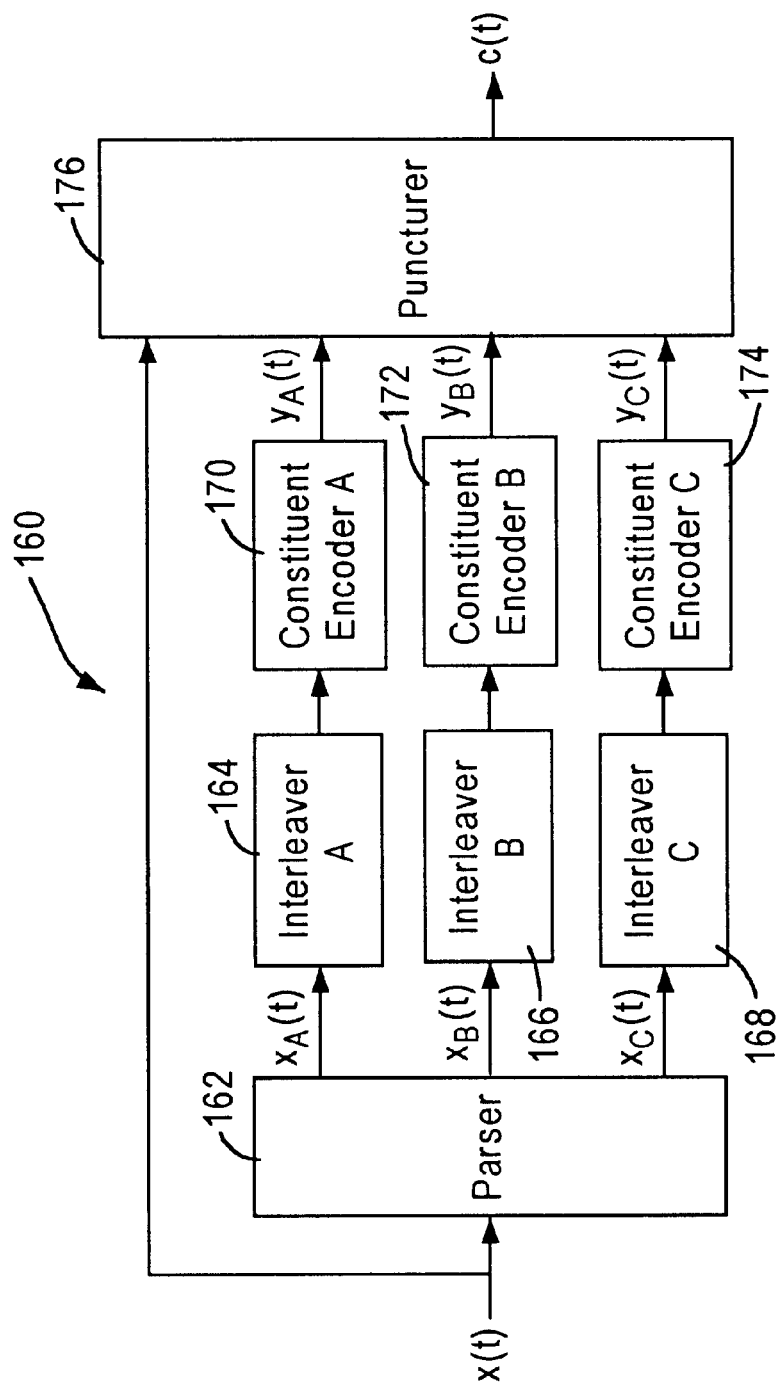
FIG. 4 is a functional block diagram of another example of a $P^2CCC$ code encoder for generating encoded data in the transmit path of the system shown in FIG. 1.

FIG. 4 illustrates an example of a turbo code encoder 160 for generating a parsed parallel concatenated convolutional code, as described in a copending U.S. Patent Application of A. Roger Hammons Jr. and Hesham El Gamal, entitled "Turbo-Like Forward Error Correction Encoder and Decoder with Improved Weight Spectrum and Reduced Degradation in the Waterfall Performance Region", Ser. No. 09/636,789, Aug. 11, 2000, the entire contents of which is incorporated herein by reference. As shown, a parser 162 in the turbo code encoder 160 includes receives source data x(t) and provides parallel source data streams $x_A(t)$, $x_B(t)$ and $x_C(t)$. The turbo code encoder 160 further includes interleavers 164, 166, and 168, and constituent encoders 170, 172 and 174 that output constituent codes $y_A(t)$, $y_B(t)$ and $y_C(t)$ to a puncturer 176, which outputs a parsed parallel concatenated convolutional code c(t).

The source data x(t) is the information to be transmitted as represented by a stream of digital systematic or information bits. As stated above, the source data x(t) is input to the parser 162 and to the puncturer 176. The parser 162 divides the stream of information bits in the source data x(t) into the parallel source data streams $x_A(t)$, $x_B(t)$ and $x_C(t)$. Each bit of the source data x(t) is copied into two of the parallel source data streams $x_A(t)$, $x_B(t)$ and $x_C(t)$ according to a parsing scheme such as the example shown below in Table 1.

TABLE 1

An example of a Parsing Scheme

| $x_0$ | $x_1$ | $x_2$ | $x_3$ | $x_4$ | $x_5$ | $x_6$ | $x_7$ | $x_8$ | $x_9$ | $x_{10}$ | $x_{11}$ | $x_{12}$ | $x_{13}$ | $x_{14}$ | $x_{15}$ | $x_{16}$ | $x_{17}$ |
|---|---|---|---|---|---|---|---|---|---|---|---|---|---|---|---|---|---|
| A | A |   | A | A |   | A | A |   | A | A |   | A | A |   | A | A |   |
| B |   | B | B |   | B | B |   | B | B |   | B | B |   | B | B |   | B |
|   | C | C |   | C | C |   | C | C |   | C | C |   | C | C |   | C | C |

Each column of Table 1 represents an information bit in the stream of source data x(t). Each row of Table 1 represents one of the parallel source data streams $x_A(t)$, $x_B(t)$ and $x_C(t)$ output from the parser 162. The parser 162 copies each information bit of the source data x(t) into two of the parallel source data streams $x_A(t)$, $x_B(t)$ and $x_C(t)$. As a result, each information bit of the source data x(t) is processed by two of the constituent encoders 170, 172 and 174 In this example, the constituent encoder 170 receives every information bit x(t) for which t=0 or 1 modulo 3, the constituent encoder 172 receives every information bit x(t) for which t=0 or 2 modulo 3, and the constituent encoder 174 receives every information bit x(t) for which t=1 or 2 modulo 3. If there are a total of N information bits, then each of the constituent encoders 170, 172, and 174 generates one-third times 2N output parity bits, or 2N/3 output parity bits. The overall composite code rate for the turbo code encoder 160 is therefore given by the equation $$R=N/[N+3(2N/3)]=1/3$$

If a higher composite code rate, such as rate 1/2, is desired, then every other parity bit from each constituent encoder 170, 172 and 174 can be punctured.

In contrast to methods in which all decoders decode all of the soft channel information bits, parsing results in each decoder decoding fewer than all of the soft channel information bite. In this example, each decoder decodes two-thirds of the soft channel information bits. An advantage of parsing is that an input sequence of source data x(t) having a low Hamming weight is split apart before being input to the constituent encoders 170, 172, and 174. For example, consider the input sequence having ones at the bit positions x(0) and x(10) and zeroes in the other ten bit positions. The input to the constituent encoder 170 consists of a critical input sequence in which the ones are separated by a distance 7 as shown by the 6 intervening "A"'s in Table 1. A critical input sequence is a typical test sequence used for measuring the performance of a code. The first constituent encoder 170 will generate a low Hamming weight output, because both ones are present in the input sequence. The smaller the distance between ones, the lower the Hamming weight output. Each of the remaining constituent encoders 172 and 174 has only a single one in their input sequences, therefore the constituent encoders 172 and 174 generate a higher Hamming weight output than the constituent encoder 170. The overall effect of parsing is to reduce the number of low Hamming weight output codes compared to methods that do not include parsing. As is well known in the art, reducing tho number of low Hamming weight output codes results in a corresponding improvement in the error asymptote performance.

The interleavers 164, 166, and 168 change the bit order of each of the parallel source data streams $x_A(t)$, $x_B(t)$ and $x_C(t)$ in a pseudo random order so that each information bit has a different time slot. Because each information bit is encoded twice, each of the redundant information bits and the corresponding parity bits are subject to independent channel noise.

The puncturer 176 concatenates the parallel constituent codes output by the constituent encoders 170, 172 and 174, removes redundant information bits and some of the parity bits according to the selected puncturing pattern, and outputs the parsed parallel concatenated convolutional code c(t). The structure described above for the P²CCC encoder 160 may be extended to more than three constituent encoders by adding additional interleavers and constituent encoders. Ideally, the parser 162 should ensure that every information bit of the source data x(t) is encoded by at least two constituent encoders so that iterative soft-decision decoding can efficiently refine the likelihood decision statistic or a priori information for each information bit of the source data x(t) from multiple semi-independent constituent decoders decoding the same information bit.

Likewise, the interleavers 164, 166, and 168 should ideally be independent from one another to generate a high degree of randomness among the constituent codes $y_A(t)$, $y_B(t)$ and $y_C(t)$. One of the interleavers 164, 166 and 168 may be the identity mapping interleaver, that is, no change in the ordering is performed. To simplify the implementation, the other interleavers could be identical, but this would result in some loss of the bit error rate performance. The constituent encoders 170, 172, and 174 may be identical or different from one another. The use of identical constituent encoders likewise simplifies implementation.

Figure 5:
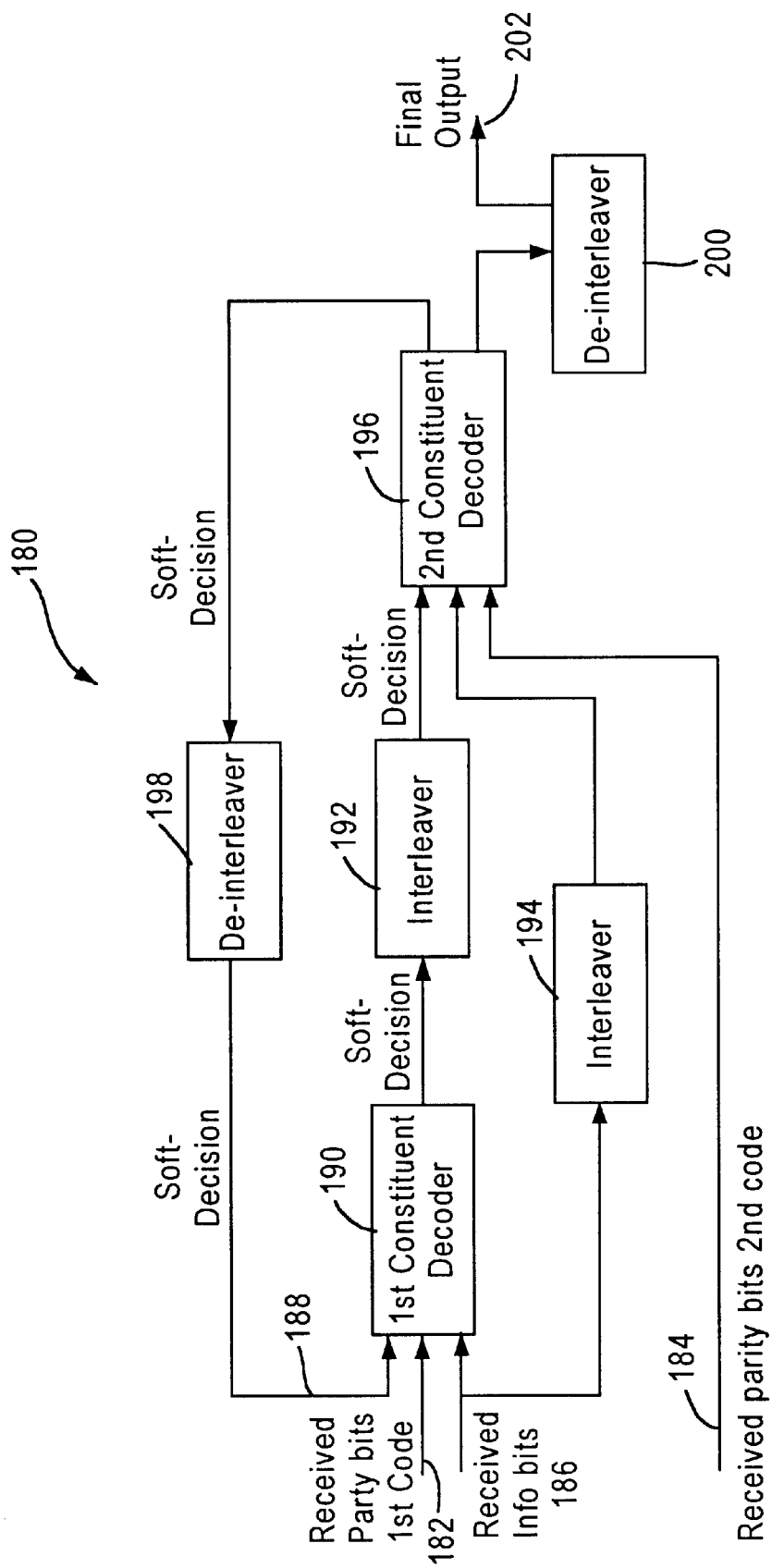
FIG. 5 is a functional block diagram of an example of a turbo code decoder for decoding constituent codes in the receive path of the system shown in FIG. 1.

FIG. 5 is a functional block diagram of an example of a conventional turbo code decoder 180 for decoding constituent codes as described, for example, in a document by C. Berrou, A. Galvieux, and P. Thitimajshima, entitled "Near Shannon Limit Error Correcting Coding and Decoding: Turbo Codes,", *Proceedings of ICC* (Geneva, Switzerland), May 1993, in a publication by S. Benedetto and G Montorsi, "Design of Parallel Concatenated Convolutional Codes", *IEEE Transactions on Communications*, May 1996, vol. COM-44, pp. 591–600, and in a publication by J. Hagenauer, E. Offer, and L. Papke, "Iterative Decoding of Binary Block and Convolutional Codes", entitled *IEEE Transactions on Information Theory*, vol. 42, no. 2, March 1996, pp. 429–445, the entire contents of each of these documents are incorporated herein by reference. Decoder 180 can be employed, for example, in decoder 132 in the receive path of the system shown in FIG. 1. The turbo code decoder 180 receives received parity bits 182 for the first constituent code, received parity bits 184 for the second constituent code, received information bits 186, and updated a priori information 188 as explained in more detail below. The turbo code decoder includes a first constituent decoder 190, a first interleaver 192, a second interleaver 194, a second constituent decoder 196, a first de-interleaver 198, and a second de-interleaver 200 that provides a decoded output 202. The received parity bits 182 for the first constituent code and the received information bits 186 from the channel de-interleaver 130 shown in FIG. 1 are input to the first constituent decoder 190 along with the updated a priori information 188.

The first constituent decoder 190 generates updated soft-decision likelihood values for the information bits and outputs the updated soft-decision likelihood values to first interleaver 192. The first interleaver 192 reorders the data in a manner identical or essentially identical to that of the interleaver 142 before the second constituent decoder 146 shown in FIG. 2 and outputs the reordered updated soft-decision likelihood value to the second constituent decoder 196. The second constituent decoder 196 also receives as input the received source data information bits interleaved by the second interleaver 194 and the received parity bits for the second constituent code 184 and generates new updated values for the soft-decision likelihood values of the information bits as output to the first de-interleaver 198. The first de-interleaver 198 restores the order of the updated soft-decision likelihood values and outputs the de-interleaved updated soft-decision likelihood values as the a priori information 188 to the first constituent decoder 190.

The decoding process described above may be repeated indefinitely, however, only a small number of iterations is usually needed to reach the point of diminishing returns. After updating the soft-decision likelihood values of the information bits for a desired number of decoding iterations, the second constituent decoder 196 uses the refined soft decision as a hard decision to determine the information bits. The information bits are output to the second de-interleaver 200, which restores the order of the decoded information bits to be generated as the decoded output 202.

If puncturing is used as illustrated in the example of the $P^2CCC$ code encoder 160 of FIG. 4, the soft-decision information from the channel for the corresponding parity bits is not available. This may be readily accounted for in the turbo code decoder 180 by using a neutral value, for example, "000", that favors neither a 0 decision nor a 1-decision for the missing channel data at the received parity bits for the first constituent code 182. If the first constituent decoder 190 is identical to the second constituent decoder 196, then the turbo code decoder 180 need only implement one constituent decoder if the circuit clock rate or the digital signal processor speed is sufficient to perform two decoding operations on each digital source data sample at the sample rate.

The mathematical theory and computations associated with iterative decoding of turbo codes and related codes are developed in detail in the publication by Hagenauer, referenced above, using the algebra of log likelihood ratios. The general principle worth special note here is that, for systematic codes, the soft output $L(\hat{u})$ associated with the information bit u is the sum of three different estimates for the log-likelihood ratio for that information bit.

$$L(\hat{u})=L_c y+L(u)+L_e(\hat{u})$$

Here, the term $L_c y$ corresponds to values received from the channel; the term $L(u)$ corresponds to a priori information; and the term $L_e(\hat{u})$ corresponds to so-called extrinsic information. Extrinsic information is new information estimated in the current iteration based on the code constraints. In general, extrinsic information computed by one constituent decoder is used as a priori information for the next constituent decoder. Final decoding of information bit u is performed by taking the sign of the final soft output $L(\hat{u})$.

The turbo decoder can be viewed conceptually as an iterative engine in which extrinsic information is processed and refined. In a publication by H. El-Gamal, A. R. Hammons Jr., and E. Geraniotis, "Analyzing the Turbo Decoder Using the Gaussian Approximation," submitted to *IEEE 2000 International Symposium on Information Theory*, Sorrento, Italy, the entire content of which is incorporated by reference herein, it is demonstrated that the convergence of the iterative decoder is largely determined by the input/output transfer function characteristics of the extrinsic information update process. If the signal-to-noise ratio of the extrinsic information is above a certain threshold, the iterative process increases the signal-to-noise ratio of the extrinsic information with each iteration, thereby guaranteeing convergence of the turbo decoder.

Figure 6:
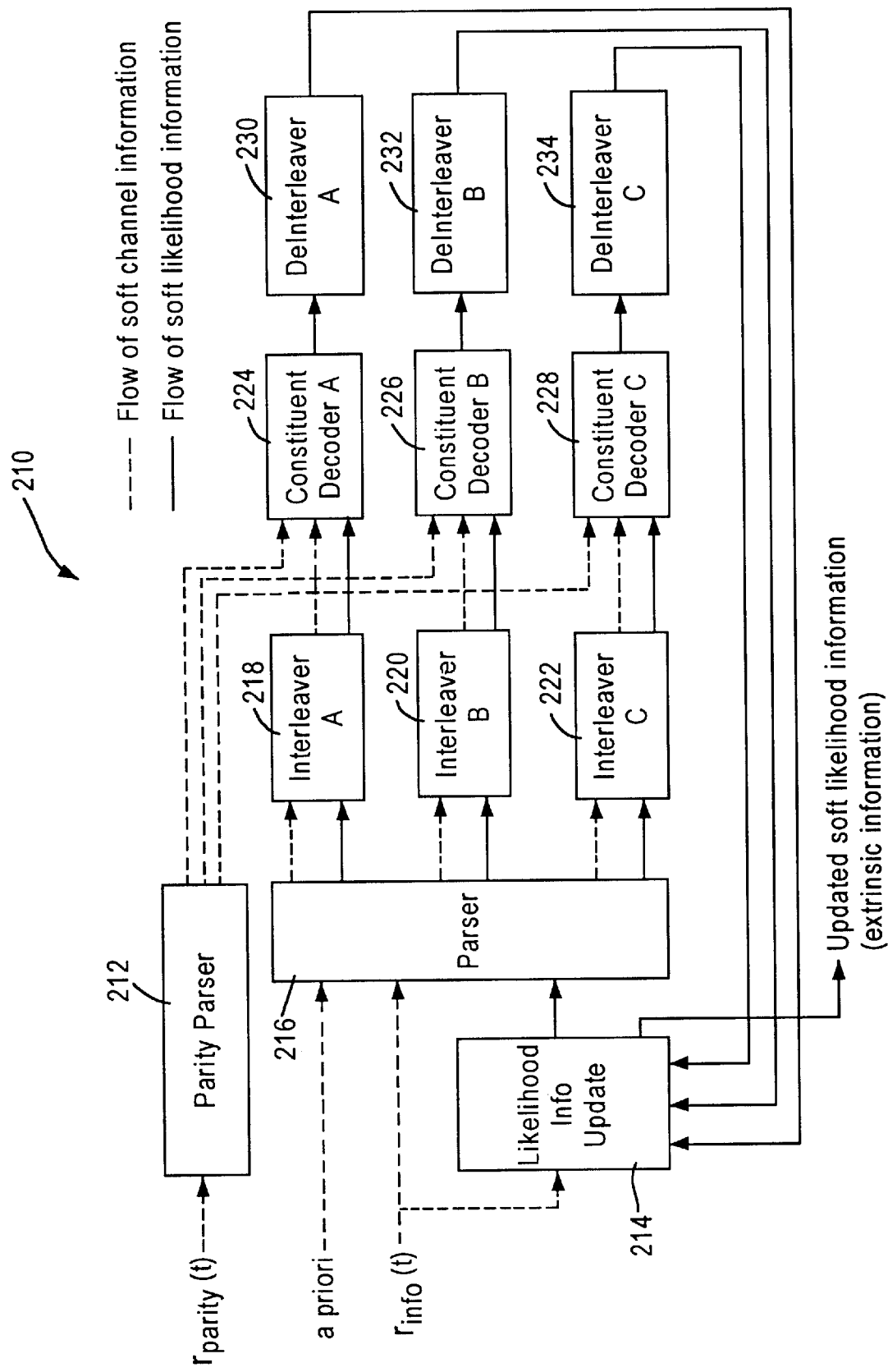
FIG. 6 is a functional block diagram of an example of a convolutional turbo-like code decoder for decoding constituent codes in the receive path of the system shown in FIG. 1 in accordance with an embodiment of the present invention.

FIG. 6 is a functional block diagram of a turbo-like code decoder 210 for decoding constituent codes that can be employed, for example, in the decoder 132 in the receive path of the system shown in FIG. 1, according an embodiment of the present invention. Turbo-like codes are codes similar to turbo codes, except that turbo-like codes implement parsing as explained above, while ordinary turbo codes do not include parsing. FIG. 6 illustrates that a soft channel parity bit stream $r_{PARITY}(t)$ is received by a parity parser 212 and a soft channel information bit stream $r_{INFO}(t)$ is received by a likelihood information update processor 214 and an information parser 216. The decoder 210 further includes interleavers 218, 220 and 222, constituent code decoders 224, 226 and 228, and de-interleavers 230, 232 and 234. The dotted flow path lines show the flow of soft channel information, while the solid flow path lines show the flow of soft likelihood information.

The turbo-like code decoder 210 may be implemented in an integrated circuit or as a program for a digital signal processor (DSP). In a manner similar to that of the turbo code decoder 180 shown in FIG. 5, the turbo like code decoder 210 implements soft-input/soft-output constituent decoders for each constituent code. The constituent decoders 224, 226, and 228 operate on the soft channel information corresponding to the information and parity bits, and on the soft likelihood information corresponding to the information bits. The constituent decoders 224, 226, and 228 could also be operated sequentially in a manner similar to that shown in FIG. 5, or in parallel if so desired. If the constituent code decoders 224, 226, and 228 are identical, then the turbo-like code decoder 210 need only implement one constituent decoder if the integrated circuit clock rate or the digital signal processor speed is sufficient to perform three decoding operations.

As illustrated in FIG. 6, the soft channel information bit stream $r_{INFO}(t)$ and its corresponding soft likelihood information (a priori information) associated with the systematic bits is parsed by the information parser 216, interleaved by the interleavers 218, 220, and 222, and output to the constituent code decoders 224, 226, and 228. The soft channel information corresponding to the parity bit stream $r_{PARITY}(t)$ is parsed by the parity parser 212 and output to the constituent code decoders 224, 226, and 228. The parsing and interleaving functions mirror those performed by the encoder, such as encoder 160 as shown in FIG. 4. Each of the constituent code decoders 224, 226, and 228 also receives as input the soft channel parity values associated with the parity bits generated by the corresponding constituent code encoder (from the parser 212). Each of the constituent code decoders 224, 226, and 228 processes the soft channel information and generates updated soft decision likelihood values for each of the information bits presented by the information parser 216. The updated soft decision likelihood values output by each of the constituent code decoders 224, 226, and 228 is combined by the likelihood update processor 214 after being de-interleaved by respective de-interleavers 230, 232 and 234 to provide updated likelihood values for all of the systematic bits, completing an iteration of the decoding process. The decoding process may be iterated indefinitely, using either a fixed stopping rule or a dynamic stopping rule. The hard decisions that determine the systematic bits may be made from the final updated soft decision likelihood values according to well known techniques. A typical fixed stopping rule would be to perform some maximum number of iterations determined by the speed and/or size of the integrated circuit or the digital signal processor implementing the turbo-like code decoder 210. A typical dynamic stopping rule would be to continue to iterate until the decoded data passes either a cyclic redundancy check (CRC) or until a maximum number of iterations is reached.

Once the desired number of iterations has been completed, hard decisions of the systematic information bits are made from the final likelihood information generated by the likelihood information update processor 214. It is also possible to stop an iteration after the soft information from any one of the constituent code decoders 224, 226, or 228 is output to the likelihood information update processor 214, which would correspond to "one third" of an iteration.

The turbo decoder may be viewed conceptually as an iterative engine in which the extrinsic information is processed and refined. If the signal-to-noise ration of the extrinsic information is above a certain threshold, the iterative process increases the signal-to-noise ratio of the extrinsic information with each iteration, guaranteeing convergence of the turbo decoder.

As will now be explained, the desired number of iterations may be advantageously performed by cascading or pipelining a corresponding number of identical decoder modules so that each decoding module operates on different information bits and corresponding parity bits in parallel.

Figure 7:
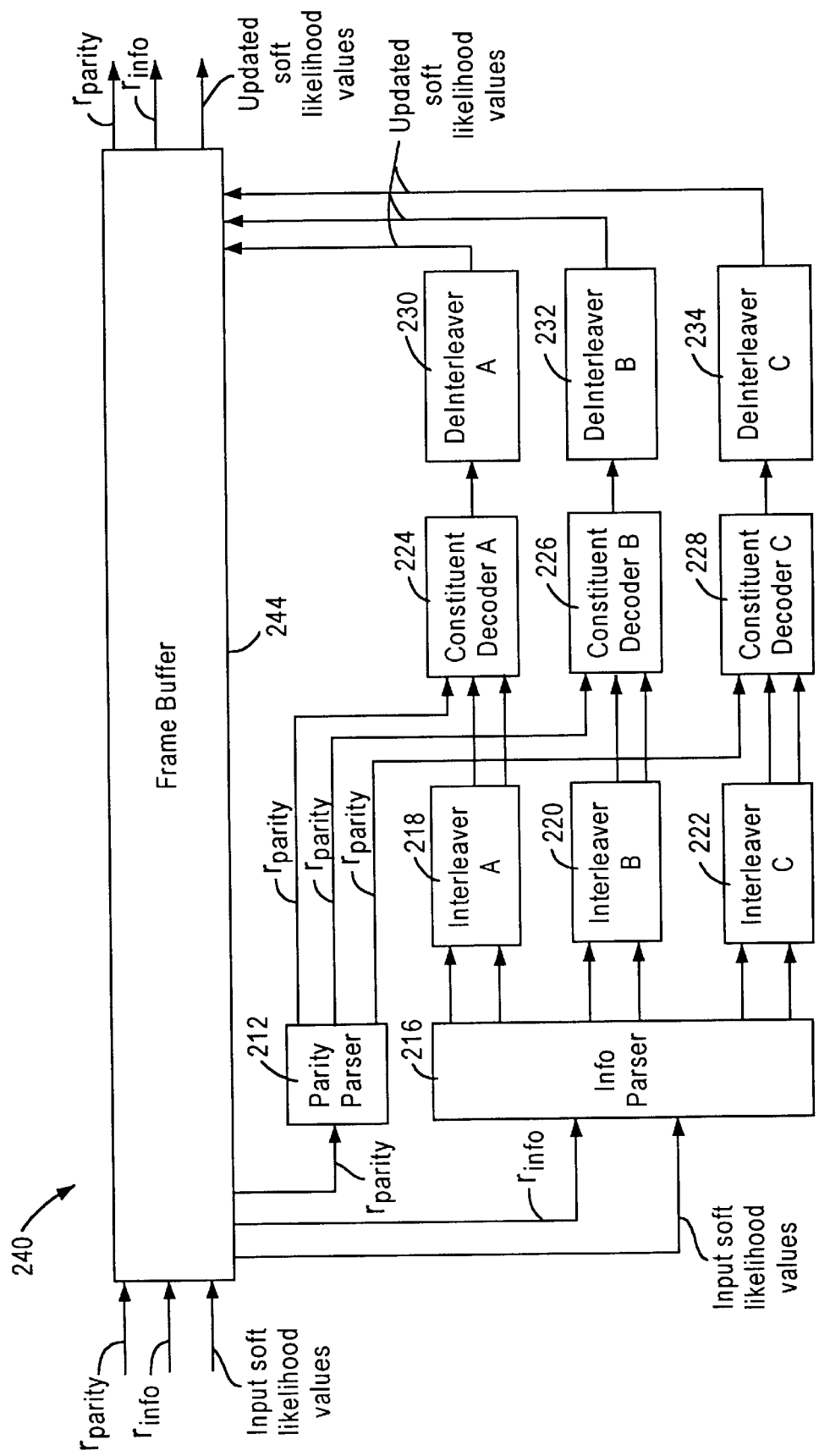
FIG. 7 is a functional block diagram of an example of a modular decoder according to an embodiment of the present invention for decoding constituent codes in, for example, the receive path of the system shown in FIG. 1.

FIG. 7 is a functional block diagram of a pipelined modular decoder 240 for decoding constituent coded data, such as turbo encoded data or turbo like encoded data, according to an embodiment of the present invention. It is noted that components shown in FIG. 7 that are identical to those shown in FIG. 6 are identified by the same reference numerals. For example, the decoder 240 includes a parity parser 212, an information parser 216, interleavers 218, 220, and 222, constituent code decoders 224, 226 and 228, and de-interleavers 230, 232 and 234, which are similar to those components shown in FIG. 6. These components collectively can be referred to as extrinsic information estimator (EIE) 242. The decoder 240 further includes a frame buffer 244 that temporarily stores a frame of soft channel and a priori values. The frame buffer 244 receives as inputs the soft channel parity values $r_{PARITY}(t)$, the soft channel information values $r_{INFO}(t)$, and the a priori information value. The a priori information bits for the first pipelined modular decoder 240 may be neutral values similar to that explained above with regard to the decoder 180 shown in FIG. 5.

The modular decoder 240 may be implemented in an integrated circuit or as a computer program product for a digital signal processor (DSP). In a manner similar to the decoder 210 shown in FIG. 6, the decoder 240 implements soft-input/soft-output constituent decoders for each constituent code.

As further shown in FIG. 7, the soft channel parity values $r_{PARITY}(t)$ are output from the frame buffer 244 to the parity parser 212. The parity parser 212 parses the parity values $r_{PARITY}(t)$ and outputs streams of the parsed parity values to the constituent code decoders 224, 226 and 228. The soft channel information values $r_{INFO}(t)$ and the soft-likelihood values are output from the frame buffer 244 to the information parser 216. The information parser 216 parses the soft channel information bits $r_{INFO}(t)$ and the a priori information bits and outputs the soft channel information bits $r_{INFO}(t)$ and the a priori information bits in bit streams to the interleavers 218, 220 and 222. The interleavers 218, 220 and 222 interleave the soft channel information bits $r_{INFO}(t)$ and the a priori information bits and output the interleaved soft channel information bits $r_{INFO}(t)$ and the a priori information bits to the constituent code decoders 224, 226 and 228. The constituent code decoders 224, 226 and 228 decode the parsed parallel concatenated convolutional codes and output the extrinsic information bits. The extrinsic information bits update, that is, replace the corresponding a priori information bits in the frame buffer 244 after being de-interleaved by respective de-interleavers 230, 232 and 234.

The contents of the frame buffer 244, that is, the soft channel parity bits $r_{PARITY}(t)$, the soft channel information bits $r_{INFO}(t)$, and the extrinsic information bits are then passed to the next decoder module 240, as described in more detail below.

It is noted that the decoder module 240 need not include information parser 216. Rather, the soft channel information bits $r_{INFO}(t)$ and the a priori information bits can be provided directly to the interleavers 218, 220 and 222, without parsing.

Figure 8:
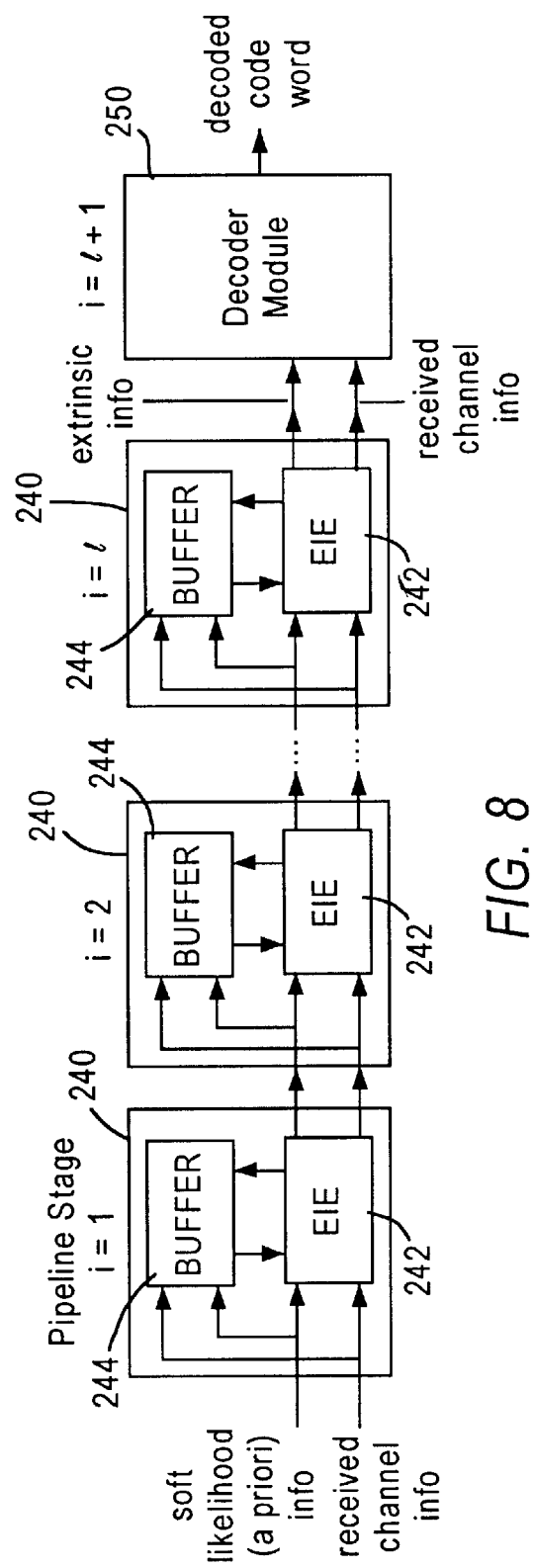
FIG. 8 is a functional block diagram of an example of a pipelined or cascaded arrangement of a plurality of modular decoders shown in FIG. 7 in accordance with an embodiment of the present invention.

FIG. 8 is a functional block diagram illustrating an example of modular architecture proposed for decoding the codes described above, and other related codes, such as constituent codes that are traditional block codes rather than convolutional codes, as well as codes used in 3g, 3GPP, 3GPP2 and DVB systems. While the modular architecture will be described in terms of a pipelined VLSI implementation, it is clear that the modular architecture could also be implemented in firmware or software on a digital signal processor (DSP) or similar platform.

As shown in FIG. 8, the proposed architecture makes use of two modules, namely, a cascadable module, such as module 240 described above, that performs updates of extrinsic information $L_e(\hat{u})$ on a per iteration basis; and a final decoder module 250 terminates the cascaded pipeline chain and produces the output code word based on the final soft output information value $L(\hat{u})$, which is the sum of the final extrinsic information, final soft likelihood information, and original channel information. Another method is to add the extrinsic information $L_e(\hat{u})$ to the a priori (soft-likelihood) information $L(u)$ in the final cascadable module (where i=l), to which the final decoder (non-cascadable) module 250 add the original soft channel information value $L_c y$ to form the final soft output information value $L(\hat{u})$.

Figure 9:
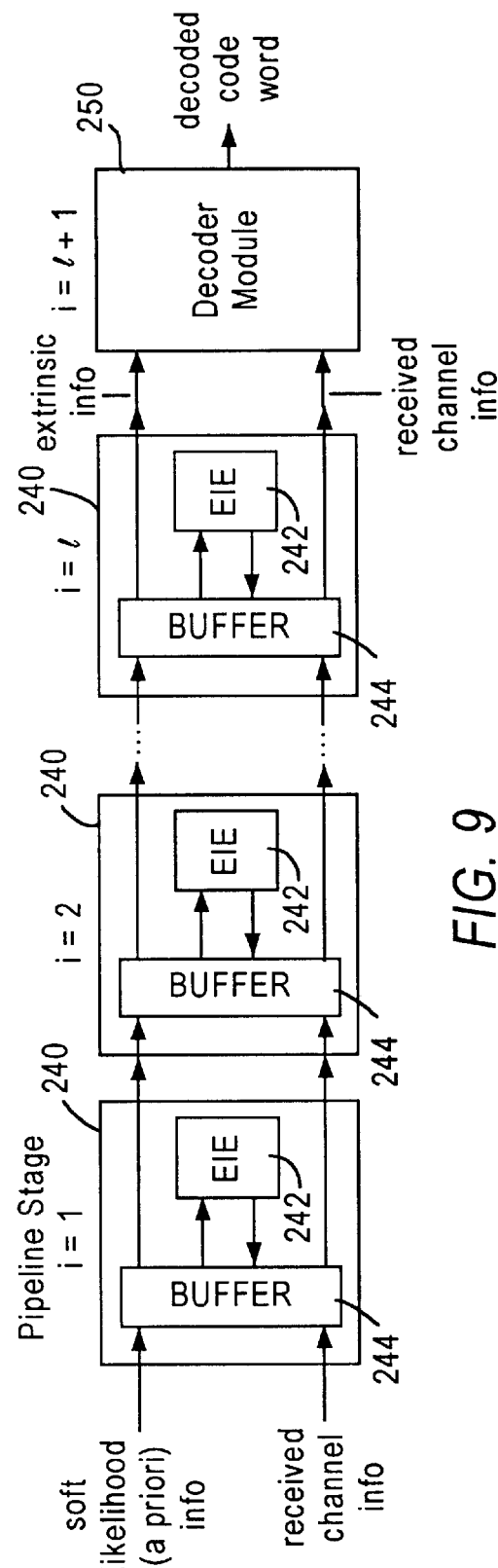
FIG. 9 is a functional block diagram of another example of a pipelined or cascaded arrangement of a plurality of modular decoders shown in FIG. 7 in accordance with an embodiment of the present invention.

As explained above with regard to FIG. 7, the cascadable module includes a buffer 244 to store information from earlier in the pipeline chain and to accommodate any differences in data latencies within the module and an EIE (extrinsic information estimator) submodule 242 that updates the extrinsic information in the manner discussed above. It is also noted that the modules 240 and 250 need not be arranged as shown in FIG. 8, but rather, can be arranged as shown in FIG. 9. Also, the buffer 242 may include, for example, a random access memory (RAM), data registers or some combination of both; and may be physically distributed rather than incorporated as an individual component within the module 240.

In the pipeline structure shown in FIGS. 8 and 9, each module 240 in the chain processes data from a different frame of received encoded data. Thus, in this illustrative example, where each of the cascadable modules 240 performs the extrinsic information updates corresponding to one decoder iteration. The final decoding module 250 takes place at the end of the processing chain after l iterations have been completed. This module 250 is executed at the next pipeline stage i=l+1. Depending on H/W timing considerations, it may also be possible for the decoder module to execute immediately after the last cascadable module during the same pipeline stage i=l. The purpose of module 250 is to output the so called a-posteriori soft information regarding the systematic bits in case there is an additional outer decoder, such as a Reed Soloman decoder (not shown), and/or hard decoded data if module 250 is indeed the final decoding module.

Figure 10:
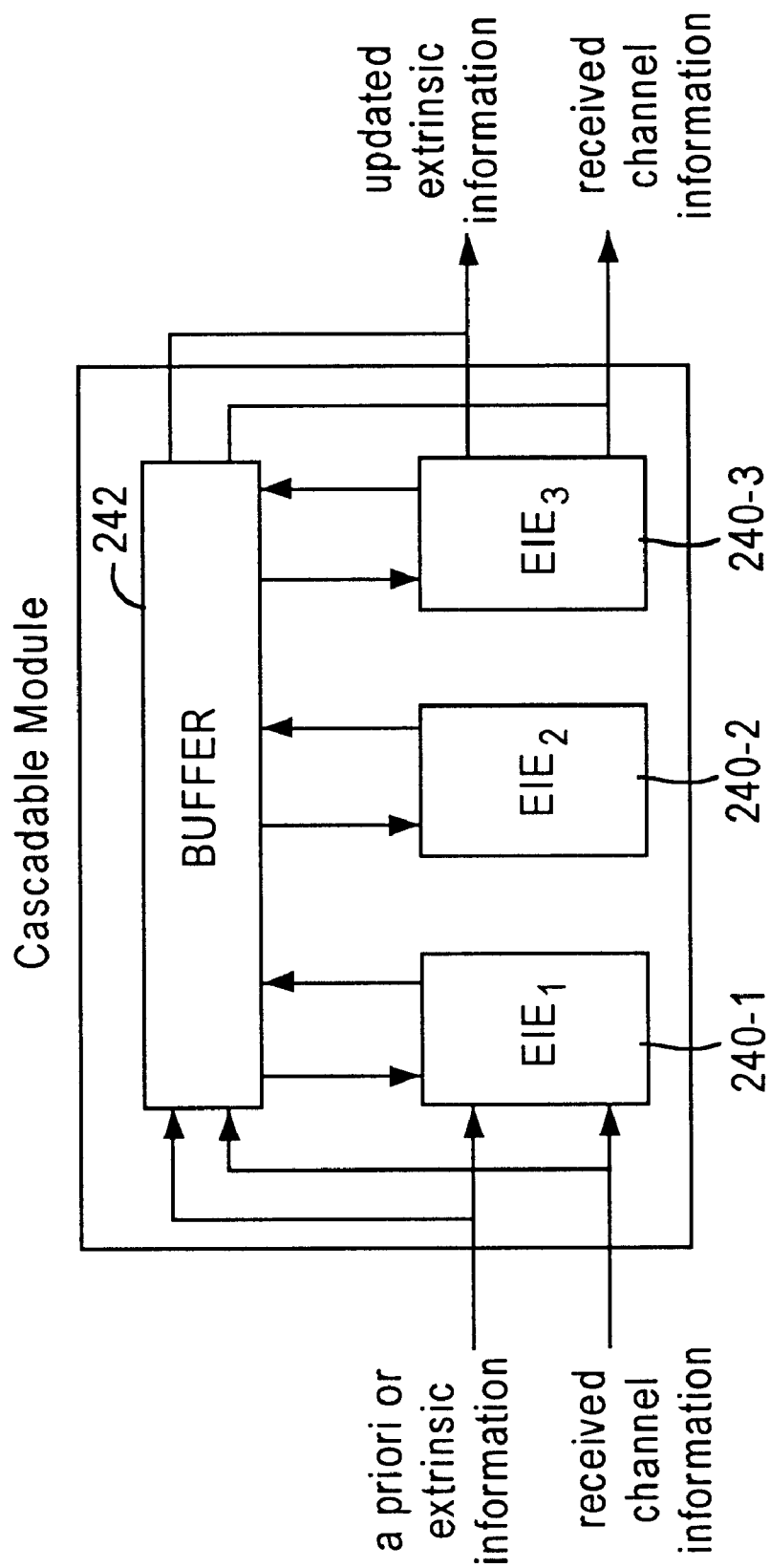
FIG. 10 is a functional block diagram of another example of a modular decoder according to an embodiment of the present invention

Another example of an arrangement of a cascadable module is shown in FIG. 10. As shown in this example, the EIE submodule 240 is decomposable into one or more constituent EIE submodules 240-1, 240-2 and 240-3 corresponding to the individual constituent encoders of the composite (turbo, $P^2CCC$, or similar) code. FIG. 10 presents a representative serial implementation appropriate for decoding coded data output by the $P^2CCC$ encoders shown in FIG. 4. The first constituent EIE submodule 240-1 processes a subset of the latest soft likelihood/extrinsic information and channel information to compute new extrinsic information regarding the information bits seen by the first constituent encoder, for example, encoder 170 shown in FIG. 4. These new extrinsic information estimates are stored in the buffer 242 and then used as soft likelihood information by the subsequent constituent EIE submodules. Likewise, the second constituent EIE submodule 240-2 processes a subset of the received channel information and the latest soft likelihood/extrinsic information available in the buffer 242 to compute new extrinsic information regarding the information bits seen by the second constituent encoder, for example, encoder 172 shown in FIG. 4. These are stored in the buffer 242 for use as soft likelihood information by the subsequent constituent EIE submodules. Finally, the third constituent EIE submodule 240-3 processes a subset of the latest soft likelihood/extrinsic information and received channel information from the buffer 242 to compute new extrinsic information regarding the information bits seen by the third constituent encoder, for example, encoder 174 shown in FIG. 4. These are then made available to the next cascadable module at the next pipeline stage.

As noted above, the partitioning of buffering and EIE processing shown in FIG. 10 is intended as an exemplary functional description and could be implemented in many, slightly different ways while remaining within the scope of the present invention. Furthermore, as long as the correct order of presentation of the input data is maintained (by implicit or explicit interleaving), the order of execution of the constituent EIE submodules 240-1 through 240-3 could also be made different from that shown, that is, $EIE_2$ (submodule 240-2) could be executed first, for example, followed by $EIE_1$ (submodule 240-1), and then by $EIE_3$ (submodule 240-3), if desired.

The final decoder module serves to compute the final soft-output information for each information bit according to the following equation:

$$L(\hat{u})=L_cy+L(u)+L_e(\hat{u})$$

The decoded bit is then given by the sign of the final soft-output information.

There are variations of the exemplary design presented in this invention disclosure that are consistent with the proposed invention and would be obvious to those skilled in the art. For example, if the hardware clock permits, additional iterations could be done by each cascadable module. If each were to do n iterations in situ, then the pipelined decoder would execute a total of nl iterations. Likewise, it would be possible that each of the cascadable modules to perform only the processing associated with one constituent encoder, relying on a pipelined chain of length three then to complete one full iteration for all three constituent encoders. As another alternative design, the constituent EIE submodules 240 could be operated in parallel on the same input data rather than in serial. In this case, the resulting different extrinsic information estimates could be weighted and combined before being stored in the buffer. It is believed, however, that the serial implementation is more efficient than the parallel approach in terms of performance improvement versus iteration number and so would usually be preferred. As mentioned earlier, the modular architecture could also be implemented in DSP or in software on a general purpose computer or similar device if processing speeds were sufficient for the application. Such an implementation could involve serial or parallel computation.

Although only a few exemplary embodiments of the present invention have been described in detail above, those skilled in the art will readily appreciate that many modifications are possible in the exemplary embodiments without materially departing from the novel teachings and advantages of this invention. For example, in addition to being employed in CDMA or TDMA systems, the embodiments described above can be employed in 3G, 3GPP, 3GPP2 and DVB systems. Accordingly, all such modifications are intended to be included within the scope of this invention as defined in the following claims.

What is claimed is:

1. A decoding system for decoding encoded data, comprising:

a parser, adapted to receive and parse the encoded data into a plurality of parsed data streams, each of said parsed data streams including a portion of said encoded data; and at least one decoder, adapted to decode said parsed data streams based on at least information included in said parsed data streams and associated soft likelihood data to provide decoded data.

2. A decoding system as claimed in claim 1, wherein:

said decoder is adapted to perform a respective decoding iteration on each respective one of said parsed data streams to provide said decoded data.

3. A decoding system as claimed in claim 1, wherein:

said at least one decoder is adapted to receive additional information pertaining to said parsed data streams, and is adapted to decode said parsed data streams based on said additional information and said information included in said parsed data streams.

4. A decoder as claimed in claim 3, wherein:

said additional information includes parity information relating to data bits in said parsed data streams.

5. A decoding system as claimed in claim 1, comprising:

a plurality of said decoders, each adapted to decode a respective one of said parsed data streams to output a respective decoded data stream as a portion of said decoded data.

6. A decoding system as claimed in claim 5, wherein:

each of said decoders is adapted to receive additional information pertaining to its said respective parsed data stream, and is adapted to decode its said respective parsed data stream based on said additional information and said information included in its said parsed data stream.

7. A decoding system as claimed in claim 6, wherein:

said additional information includes parity information relating to data bits in said parsed data streams.

8. A decoding system as claimed in claim 1, wherein:
said at least one decoder includes a constituent decoder.
9. A decoding system as claimed in claim 1, wherein:
said encoded data includes direct video broadcast data.
10. A decoding system as claimed in claim 1, wherein:
said decoded data includes soft decision data relating to said encoded data.
11. A system for decoding encoded data, comprising:
a parser, adapted to receive and parse the encoded data into a plurality of parsed data streams, each of said parsed data streams including a portion of said encoded data; and
at least one soft decoder module, adapted to perform multiple decoding iterations on said parsed data streams to provide soft decision data relating to said encoded data; and
another decoder module, adapted to decode said encoded data based on said soft decision data to provide at least one of hard decoded data representative of a decoded condition of said encoded data and soft decision data relating to said encoded data.
12. A system as claimed in claim 11, comprising:
a plurality of said soft decoder modules, arranged in succession such that a first of said soft decoder modules in said succession is adapted to receive at least a respective portion of said encoded data and decode said respective portion of said encoded data based on at least information included in said respective portion of said encoded data to provide soft decision information relating to said encoded data, and each of said decoder modules other than said first decoder module is adapted to receive at least a respective portion of said encoded data and decode its said respective portion of said encoded data based on at least information included in its said respective portion of said encoded data and said intermediate soft decision data provided from at least one other of said decoder modules, to provide soft decision information, said soft decision information from a last of said soft decoder modules in said succession being said soft decision data.
13. A system as claimed in claim 11, wherein:
each said soft decoder module includes at least one decoder, adapted to perform at least one of said decoding iterations.
14. A system as claimed in claim 11, wherein:
each said soft decoder module includes a plurality of decoders, each adapted to perform a respective one of said decoding iterations.
15. A system as claimed in claim 11, wherein:
each said soft decoder module includes a buffer, adapted to temporarily store information pertaining to decoding said encoded data while said decoding iterations are being performed.
16. A system as claimed in claim 11, wherein:
said at least one decoder module provides said soft decision data without providing hard decision data pertaining to said encoded data.
17. A method for decoding encoded data, comprising:
parsing the encoded data into a plurality of parsed data streams, each of said parsed data streams including a portion of said encoded data; and
decoding said parsed data streams based on at least information included in said parsed data streams and associated soft likelihood data to provide decoded data.
18. A method as claimed in claim 17, wherein:
said decoding includes performing a respective decoding iteration on each respective one of said parsed data streams to provide said decoded data.
19. A method as claimed in claim 17, wherein:
said decoding includes decoding said parsed data streams based on additional information pertaining to said parsed data streams and said information included in said parsed data streams.
20. A method as claimed in claim 19, wherein:
said additional information includes parity information relating to data bits in said parsed data streams.
21. A method as claimed in claim 17, wherein:
said decoding includes receiving and decoding each respective one of said parsed data streams at a respective one of a plurality of decoders, and outputting from each of said decoders a respective decoded data stream as a portion of said decoded data.
22. A method as claimed in claim 21, further comprising:
providing to each of said decoders additional information pertaining to its said respective parsed data stream; and
said decoding includes decoding each respective one of said parsed data streams at said respective decoders based on said additional information and said information included in its said respective parsed data streams.
23. A method as claimed in claim 22, wherein:
said additional information includes parity information relating to data bits in said parsed data streams.
24. A method as claimed in claim 21, wherein:
said at least one decoder includes a constituent decoder.
25. A method as claimed in claim 17, wherein:
said encoded data includes direct video broadcast data.
26. A method as claimed in claim 17, wherein:
said decoded data includes soft decision data relating to said encoded data.
27. A method for decoding encoded data, comprising:
parsing the encoded data into a plurality of parsed data streams, each of said parsed data streams including a portion of said encoded data; and
performing multiple decoding iterations on said encoded data to provide soft decision data relating to said parsed data; and
decoding said encoded data based on said soft decision data to provide at least one of hard decoded data representative of a decoded condition of said encoded data and soft decision data relating to said encoded data.
28. A method as claimed in claim 27, wherein:
said performing step includes receiving said encoded data at a plurality of soft decoder modules, arranged in succession such that a first of said soft decoder modules in said succession is adapted to receive at least a respective portion of said encoded data and decode said respective portion of said encoded data based on at least information included in said respective portion of said encoded data to provide soft decision information relating to said encoded data, and each of said decoder modules other than said first decoder module is adapted to receive at least a respective portion of said encoded data and decode its said respective portion of said encoded data based on at least information included in its said respective portion of said encoded data and said intermediate soft decision data provided from at least one other of said decoder modules, to provide soft decision information, said soft decision information from a last of said soft decoder modules in said succession being said soft decision data.

29. A method as claimed in claim 28, wherein:
each said soft decoder module includes at least one decoder, adapted to perform at least one of said decoding iterations.

30. A method as claimed in claim 28, wherein:
each said soft decoder module includes a plurality of decoders, each adapted to perform a respective one of said decoding iterations.

31. A method as claimed in claim 27, further comprising:
temporarily storing information pertaining to decoding said encoded data while said decoding iterations are being performed.

32. A method as claimed in claim 27, wherein:
said performing decoding iterations step includes providing said soft decision data without providing hard decision data pertaining to said encoded data.

33. A computer readable medium of instructions, adapted to control a decoder module in a communications system to decode encoded data, comprising:
a first set of instructions, adapted to control said decoder module to parse the encoded data into a plurality of parsed data streams, each of said parsed data streams including a portion of said encoded data; and
a second set of instructions, adapted to control said decoder module to decode said parsed data streams based on at least information included in said parsed data streams and associated soft likelihood data to provide decoded data.

34. A computer readable medium of instructions as claimed in claim 33, wherein:
said second set of instructions is adapted to control said decoder module to perform a respective decoding iteration on each respective one of said parsed data streams to provide said decoded data.

35. A computer readable medium of instructions as claimed in claim 33, wherein:
said second set of instructions is adapted to control said decoder module to decode said parsed data streams based on additional information pertaining to said parsed data streams and said information included in said parsed data streams.

36. A computer readable medium of instructions as claimed in claim 35, wherein:
said additional information includes parity information relating to data bits in said parsed data streams.

37. A computer readable medium of instructions as claimed in claim 33, wherein:
said second set of instructions is adapted to control each of a plurality of decoders in said decoder module to receive and decode a respective one of said parsed data streams and output a respective decoded data stream as a portion of said decoded data.

38. A computer readable medium of instructions as claimed in claim 37, wherein:
said at least one decoder includes a constituent decoder.

39. A computer readable medium of instructions as claimed in claim 33, wherein:
said second set of instructions is further adapted to control said decoder to decode each of said parsed data streams based on an additional information pertaining to said parsed data streams and said information included in said parsed data streams.

40. A computer readable medium of instructions as claimed in claim 39, wherein:
said additional information includes parity information relating to data bits in said parsed data streams.

41. A computer readable medium of instructions as claimed in claim 33, wherein:
said encoded data includes direct video broadcast data.

42. A computer readable medium of instructions as claimed in claim 33, wherein:
said decoded data includes soft decision data relating to said encoded data.

43. A computer readable medium of instructions, adapted to control a decoding module to decode encoded data, comprising:
a first set of instructions adapted to control a parsing module to parse encoded data into a plurality of parsed data streams including a portion of said encoded data;
a second set of instructions, adapted to control said decoding module to perform multiple decoding iterations on said encoded data to provide soft decision data relating to said encoded data; and
a third set of instructions, adapted to control said decoding module to decode said encoded data based on said soft decision data to provide at least one of hard decoded data representative of a decoded condition of said encoded data and soft decision data relating to said encoded data.

44. A computer readable medium of instructions as claimed in claim 43, wherein:
said second set of instructions is adapted to control said decoder module to provide said encoded data to a plurality of soft decoder modules, arranged in succession, such that said first set of instructions is adapted to control a first of said soft decoder modules in said succession to receive at least a respective portion of said encoded data and decode said respective portion of said encoded data based on at least information included in said respective portion of said encoded data to provide soft decision information relating to said encoded data, and said second of instructions is adapted to control each of said decoder modules other than said first decoder module to receive at least a respective portion of said encoded data and decode its said respective portion of said encoded data based on at least information included in its said respective portion of said encoded data and said intermediate soft decision data provided from at least one other of said decoder modules, to provide soft decision information, said soft decision information from a last of said soft decoder modules in said succession being said soft decision data.

45. A computer readable medium of instructions as claimed in claim 44, wherein:
each said soft decoder module includes at least one decoder; and
said second set of instructions is adapted to control each said decoder to perform at least one of said decoding iterations.

46. A computer readable medium of instructions as claimed in claim 44, wherein:
each said soft decoder module includes a plurality of decoders; and
said second set of instructions is adapted to control each of said decoders to perform a respective one of said decoding iterations.

47. A computer readable medium of instructions as claimed in claim 43, further comprising:
a fourth set of instructions, adapted to control said decoder module to temporarily store information pertaining to decoding said encoded data while said decoding iterations are being performed.

48. A computer readable medium of instructions as claimed in claim 43, wherein:

said second set of instructions is adapted to control said decoder module to provide said soft decision data without providing hard decision data pertaining to said encoded data.

* * * * *